United States Patent
Chen et al.

(10) Patent No.: US 9,743,511 B1
(45) Date of Patent: Aug. 22, 2017

(54) RIGID FLEX CIRCUIT BOARD

(71) Applicant: QUN HONG TECHNOLOGY INC, Taoyuan (TW)

(72) Inventors: Chi-Shiang Chen, New Taipei (TW); Fang-Ping Wu, Taoyuan (TW)

(73) Assignee: QUN HONG TECHNOLOGY INC, Taoyuan (TW)

( * ) Notice: Subject to any disclaimer, the term of this patent is extended or adjusted under 35 U.S.C. 154(b) by 0 days.

(21) Appl. No.: 15/361,011

(22) Filed: Nov. 24, 2016

(30) Foreign Application Priority Data

Sep. 20, 2016 (TW) ............... 105130294 A

(51) Int. Cl.
| | |
|---|---|
| *H05K 1/02* | (2006.01) |
| *H05K 1/11* | (2006.01) |
| *H05K 3/46* | (2006.01) |
| *H05K 1/14* | (2006.01) |
| *H05K 1/03* | (2006.01) |

(52) U.S. Cl.
CPC ........... *H05K 1/0278* (2013.01); *H05K 1/115* (2013.01); *H05K 1/118* (2013.01); *H05K 3/4691* (2013.01); *H05K 1/0393* (2013.01); *H05K 1/11* (2013.01); *H05K 1/147* (2013.01); *H05K 2201/05* (2013.01); *H05K 2201/068* (2013.01)

(58) Field of Classification Search
CPC .... H05K 1/0278; H05K 1/115; H05K 3/4691; H05K 2201/068
See application file for complete search history.

(56) References Cited

U.S. PATENT DOCUMENTS

| | | | | |
|---|---|---|---|---|
| 5,206,463 A | * | 4/1993 | DeMaso | H05K 3/4691 174/254 |
| 6,902,949 B2 | * | 6/2005 | Yamazaki | H01L 21/4857 174/254 |
| 9,125,307 B2 | * | 9/2015 | Ozeki | H05K 3/022 |
| 2009/0232925 A1 | * | 9/2009 | Lin | H05K 3/0044 425/306 |
| 2011/0094776 A1 | * | 4/2011 | Lee | H05K 1/0218 174/254 |

FOREIGN PATENT DOCUMENTS

TW    I481322    4/2015

* cited by examiner

*Primary Examiner* — Ishwarbhai B Patel
(74) *Attorney, Agent, or Firm* — Jianq Chyun IP Office

(57) ABSTRACT

A rigid flex circuit board is provided, including a flexible circuit board, which includes a core layer, first and second cover layers, first and second bonding layers, first and second dielectric layers, and first and second superposition layers. The core layer includes first and second core circuit layers. The first and second cover layers cover a portion of the first and second core circuit layers. The first and second bonding layers cover a portion of the first and second cover layers. The first and second dielectric layers cover a portion of the first and second core circuit layers and the first and second cover layers. The first superposition layer is disposed on the first bonding layer and the first dielectric layer, and the second superposition layer is disposed on the second bonding layer and the second dielectric layer.

11 Claims, 3 Drawing Sheets

RIGID FLEX CIRCUIT BOARD

CROSS-REFERENCE TO RELATED APPLICATION

This application claims the priority benefit of Taiwan application serial no. 105130294, filed on Sep. 20, 2016. The entirety of the above-mentioned patent application is hereby incorporated by reference herein and made a part of this specification.

BACKGROUND OF THE INVENTION

Field of the Invention

The invention relates to a rigid flex circuit board, and more particularly, to a rigid flex circuit board capable of improving thermal shock reliability.

Description of Related Art

Based on the flexibility of the insulating layer, the circuit board can be divided into a rigid circuit board and a flexible circuit board. When electronic components are soldered to the flexible circuit board, the flexible circuit board cannot provide sufficient structural strength. Moreover, when electronic components are soldered, although the rigid circuit board provides better structural strength, the flexibility thereof is poor, and therefore the application of the rigid circuit board is limited.

The rigid flex circuit board is a combination of a flexible circuit board and a rigid circuit board, and has both the flexibility of the flexible circuit board and the structural strength of the rigid circuit board. When the rigid flex circuit board is manufactured via conventional process, to achieve the characteristics of the bent region of a flex sheet, a bonding sheet is generally used to laminate the entire sheet surface. However, after repeated lamination process, the process conditions of high temperature and high pressure may cause layering to the flex sheet between the bonding sheets, or risk of compromised reliability during thermal shock test. Moreover, in the design of a multi-layer flex sheet, if copper layers of the flex sheet layer are disposed facing each other, then short circuit may occur, and therefore the design limit that copper layers cannot be stacked facing each other exists, such that the cost of the flex sheet material is increased.

Based on the above, how to solve the issue of compromised reliability of the multi-layer flex sheet in thermal shock testing and overcome the design limitation that copper layers cannot be disposed facing each other at the same time is an important object for those skilled in the art.

SUMMARY OF THE INVENTION

The invention provides a rigid flex circuit board capable of improving the reliability of a multi-layer flex sheet in thermal shock testing and overcoming the design limitation that copper layers cannot be stacked facing each other.

The invention provides a rigid flex circuit board including a flexible circuit board. The flexible circuit board includes a core layer, first and second cover layers, first and second bonding layers, first and second insulating layers, and first and second superposition layers. The core layer includes a core dielectric layer having a first surface and a second surface, a first core circuit layer, and a second core circuit layer, wherein the first core circuit layer and the second core circuit layer are respectively located on the first surface and the second surface. The first cover layer covers a portion of the first core circuit layer, and the second cover layer covers a portion of the second core circuit layer. The first bonding layer covers a portion of the first cover layer, and the second bonding layer covers a portion of the second cover layer. The first insulating layer covers a portion of the first core circuit layer and a portion of the first cover layer, wherein the thickness of the first insulating layer is comparable to the thicknesses of the first cover layer and the first bonding layer. The second insulating layer covers a portion of the second core circuit layer and a portion of the second cover layer, wherein the thickness of the second insulating layer is comparable to the thicknesses of the second cover layer and the second bonding layer. The first superposition layer includes a first flex sheet layer and a first circuit layer and is disposed on the first bonding layer and the first insulating layer. The second superposition layer includes a second flex sheet layer and a second circuit layer and is disposed on the second bonding layer and the second insulating layer.

In an embodiment of the invention, the first cover layer includes a first adhesive layer and a first polyimide layer in order from the bottom up, and the second cover layer includes a second adhesive layer and a second polyimide layer in order from the bottom up.

In an embodiment of the invention, the material of the first bonding layer and the second bonding layer includes a glue material.

In an embodiment of the invention, the rigid flex circuit board further includes a first rigid circuit board and a second rigid circuit board. The first rigid circuit board has a first opening and is disposed on the first superposition layer. The second rigid circuit board has a second opening and is disposed on the second superposition layer. A first dielectric layer and a third cover layer are disposed between the first rigid circuit board and the first superposition layer, and the first opening exposes a portion of the third cover layer. A second dielectric layer and a fourth cover layer are disposed between the second rigid circuit board and the second superposition layer, and the second opening exposes a portion of the fourth cover layer.

In an embodiment of the invention, the first rigid circuit board includes a plurality of first conductive layers, a plurality of first rigid insulating layers, and a plurality of first conductive vias, wherein the first conductive vias pass through the first conductive layers and the first rigid insulating layers such that the first conductive layers are electrically connected. The second rigid circuit board includes a plurality of second conductive layers, a plurality of second hard sheet insulating layers, and a plurality of second conductive vias, wherein the second conductive vias pass through the second conductive layers and the second hard sheet insulating layers such that the second conductive layers are electrically connected.

In an embodiment of the invention, the rigid flex circuit board further includes a first solder resist layer and a second solder resist layer. The first solder resist layer is disposed on the first rigid circuit board, and the second solder resist layer is disposed on the second rigid circuit board.

In an embodiment of the invention, the rigid flex circuit board further includes a third conductive via. The third conductive via passes through the flexible circuit board, the first rigid circuit board, the second rigid circuit board, the first dielectric layer, and the second dielectric layer to electrically connect the flexible circuit board, the first rigid circuit board, and the second rigid circuit board.

The invention provides a rigid flex circuit board including a flexible circuit board, a first rigid circuit board, and a second rigid circuit board. The flexible circuit board includes a core layer, first and second cover layers, first and second bonding layers, first and second insulating layers, and first and second superposition layers. The core layer includes a core dielectric layer having a first surface and a second surface, a first core circuit layer, and a second core circuit layer, wherein the first core circuit layer and the second core circuit layer are respectively located on the first surface and the second surface. The first cover layer covers a portion of the first core circuit layer, and the second cover layer covers a portion of the second core circuit layer. The first bonding layer covers a portion of the first cover layer, and the second bonding layer covers a portion of the second cover layer. The first insulating layer covers a portion of the first core circuit layer and a portion of the first cover layer, wherein the thickness of the first insulating layer is comparable to the thicknesses of the first cover layer and the first bonding layer. The second insulating layer covers a portion of the second core circuit layer and a portion of the second cover layer, wherein the thickness of the second insulating layer is comparable to the thicknesses of the second cover layer and the second bonding layer. The first superposition layer includes a first flex sheet layer and a first circuit layer and is disposed on the first bonding layer and the first insulating layer. The second superposition layer includes a second flex sheet layer and a second circuit layer and is disposed on the second bonding layer and the second insulating layer. The first rigid circuit board has a first opening and is disposed on the first superposition layer. The second rigid circuit board has a second opening and is disposed on the second superposition layer. A first dielectric layer and a third cover layer are disposed between the first rigid circuit board and the first superposition layer, and the first opening exposes a portion of the third cover layer. A second dielectric layer and a fourth cover layer are disposed between the second rigid circuit board and the second superposition layer, and the second opening exposes a portion of the fourth cover layer.

In an embodiment of the invention, the first cover layer includes a first adhesive layer and a first polyimide layer in order from the bottom up, and the second cover layer includes a second adhesive layer and a second polyimide layer in order from the bottom up.

In an embodiment of the invention, the material of the first bonding layer and the second bonding layer includes a glue material.

In an embodiment of the invention, the first rigid circuit board includes a plurality of first conductive layers, a plurality of first rigid insulating layers, and a plurality of first conductive vias, wherein the first conductive vias pass through the first conductive layers and the first rigid insulating layers such that the first conductive layers are electrically connected. The second rigid circuit board includes a plurality of second conductive layers, a plurality of second hard sheet insulating layers, and a plurality of second conductive vias, wherein the second conductive vias pass through the second conductive layers and the second hard sheet insulating layers such that the second conductive layers are electrically connected.

In an embodiment of the invention, the rigid flex circuit board further includes a first solder resist layer and a second solder resist layer. The first solder resist layer is disposed on the first rigid circuit board, and the second solder resist layer is disposed on the second rigid circuit board.

In an embodiment of the invention, the rigid flex circuit board further includes a third conductive via. The third conductive via passes through the flexible circuit board, the first rigid circuit board, the second rigid circuit board, the first dielectric layer, and the second dielectric layer to electrically connect the flexible circuit board, the first rigid circuit board, and the second rigid circuit board.

Based on the above, the invention provides a rigid flex circuit board, and in the flexible circuit board of the rigid flex circuit board, different from the prior art in which a complete bonding layer is used to laminate the flex sheets, the circuit layers are partially covered using a cover layer, and then the bonding layer and the cover layer are partially laminated to expose a portion of the cover layer. At the same time, a polypropylene insulating layer is disposed in the region outside the bonding layer and the cover layer between the flex sheets. That is, in the rigid flex circuit board of the invention, a polypropylene material is used between the flex sheets, and the bent region of the flex sheets is a combination of a partially laminated cover layer and bonding layer. As a result, the reliability of the multi-layer flex sheet in thermal shock testing can be improved, and the design limit that copper layers cannot be stacked facing each other is overcame, and even if copper layers are disposed facing each other, the issue of short circuit still does not readily occur, and therefore the cost of the flex sheet material is reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1F are cross-sectional schematics of the manufacturing process of a rigid flex circuit board shown according to an embodiment of the invention.

Figure 1A:
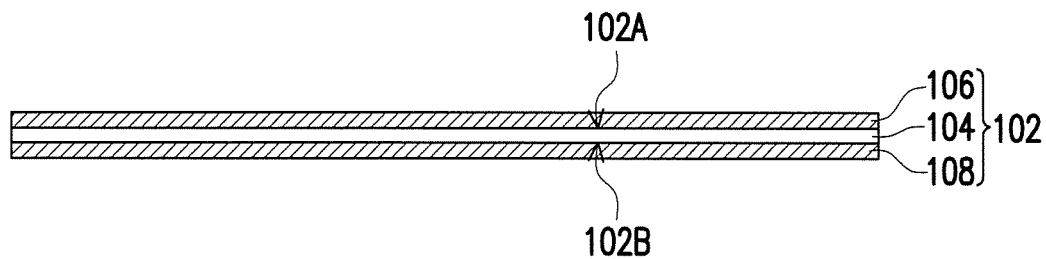
FIG. 1A to FIG. 1F are cross-sectional schematics of the manufacturing process of a rigid flex circuit board shown according to an embodiment of the invention.

First, referring to FIG. 1A, a core layer 102 is provided, wherein the core layer 102 includes a core dielectric layer 104 having a first surface 102A and a second surface 102B, a first core circuit layer 106, and a second core circuit layer 108. The first core circuit layer 106 and the second core circuit layer 108 are respectively located on the first surface 102A and the second surface 102B. More specifically, the first core circuit layer 106 and the second core circuit layer 108 are, for instance, copper layers or copper alloy layers.

Figure 1B:
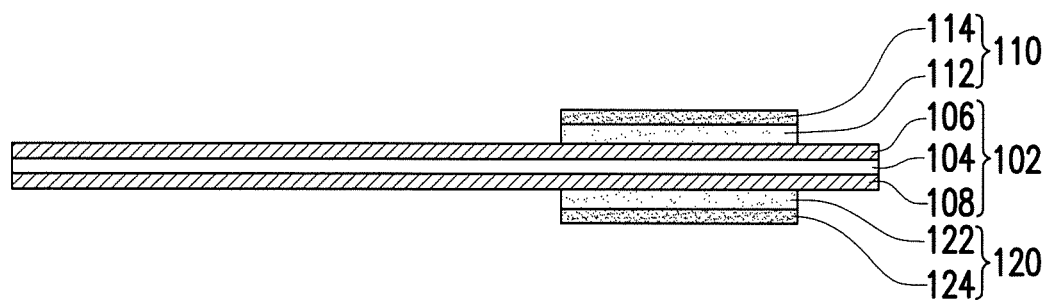

Next, referring to FIG. 1B, a first cover layer 110 and a second cover layer 120 are formed. The first cover layer 110 covers a portion of the first core circuit layer 106, and the second cover layer 120 covers a portion of the second core circuit layer 108. More specifically, the first cover layer 110 includes a first adhesive layer 112 and a first polyimide layer 114 in order from the bottom up, and the second cover layer 120 includes a second adhesive layer 122 and a second polyimide layer 124 in order from the bottom up. In the present embodiment, a pretreatment can be performed using, for instance, a die cutter or a cutting method to obtain the first cover layer 110 and the second cover layer 120 having the desired size, the size of the first cover layer 110 and the second cover layer 120 can be adjusted based on actual operating requirement, and the size of the first cover layer 110 is, for instance, comparable to the size of the second cover layer 120.

Figure 1C:
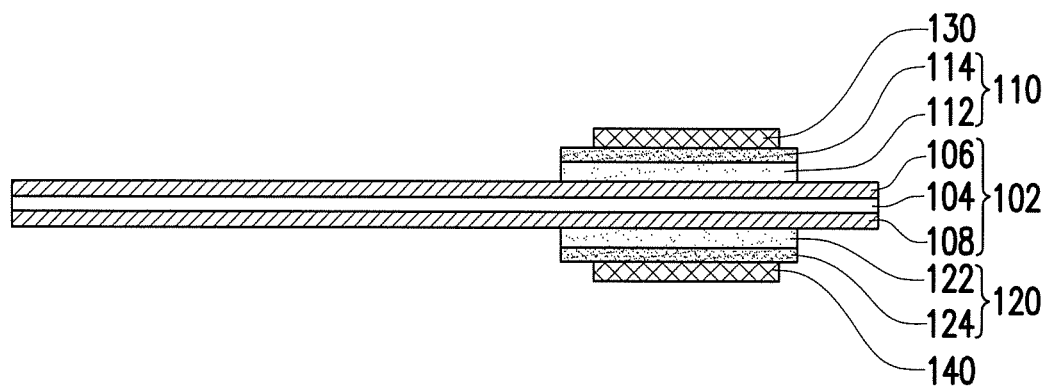

Next, referring to FIG. 1C, a first bonding layer 130 and a second bonding layer 140 are formed. The first bonding layer 130 covers a portion of the first cover layer 110, and the second bonding layer 140 covers a portion of the second cover layer 120. More specifically, the material of the first bonding layer 130 and the second bonding layer 140 can include a glue material. As shown in FIG. 1B and FIG. 1C, different from the prior art in which a complete bonding layer is used to laminate the flex sheets, in the present embodiment, the first core circuit layer 106 and the second core circuit layer 108 are partially covered respectively using the first cover layer 110 and the second cover layer 120. Next, the first bonding layer 130 and the first cover layer 110 are partially laminated, and the second bonding layer 140 and the second cover layer 120 are partially laminated to expose a portion of the first cover layer 110 and the second cover layer 120.

In the present embodiment, a pretreatment can be performed using, for instance, a die cutter or a cutting method to obtain the first bonding layer 130 and the second bonding layer 140 having the desired size, and the size of the first bonding layer 130 and the second bonding layer 140 can be adjusted according to actual operating requirement, wherein the widths of the first bonding layer 130 and the second bonding layer 140 are respectively less than the widths of the first cover layer 110 and the second cover layer 120, and the size of the first bonding layer 130 is, for instance, comparable to the size of the second bonding layer 140.

Figure 1D:
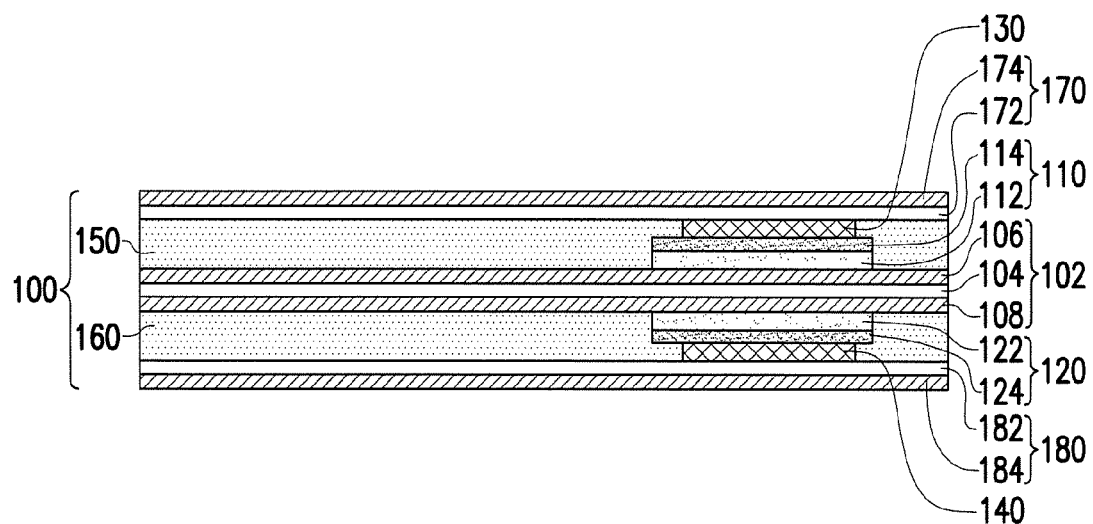

Next, referring to FIG. 1D, a first insulating layer 150 and a second insulating layer 160 are formed. The first insulating layer 150 covers a portion of the first core circuit layer 106 and a portion of the first cover layer 110, wherein the thickness of the first insulating layer 150 is, for instance, comparable to the thicknesses of the first cover layer 110 and the first bonding layer 130. The second insulating layer 160 covers a portion of the second core circuit layer 108 and a portion of the second cover layer 120, wherein the thickness of the second insulating layer 160 is, for instance, comparable to the thicknesses of the second cover layer 120 and the second bonding layer 140. More specifically, the material of the first insulating layer 150 and the second insulating layer 160 is, for instance, polypropylene. In the present embodiment, a pretreatment can be performed using, for instance, a die cutter or a routing method to obtain the first insulating layer 150 and the second insulating layer 160 having an opening.

Next, referring further to FIG. 1D, a first superposition layer 170 is formed on the first bonding layer 130 and the first insulating layer 150, and a second superposition layer 180 is formed on the second bonding layer 140 and the second insulating layer 160. The first superposition layer 170 can include a first soft layer 172 and a first circuit layer 174, and the second superposition layer 180 can include a second soft layer 182 and a second circuit layer 184. More specifically, the first circuit layer 174 and the second circuit layer 184 are, for instance, copper layers. As a result, the manufacture of the flexible circuit board 100 can be completed.

Figure 1E:
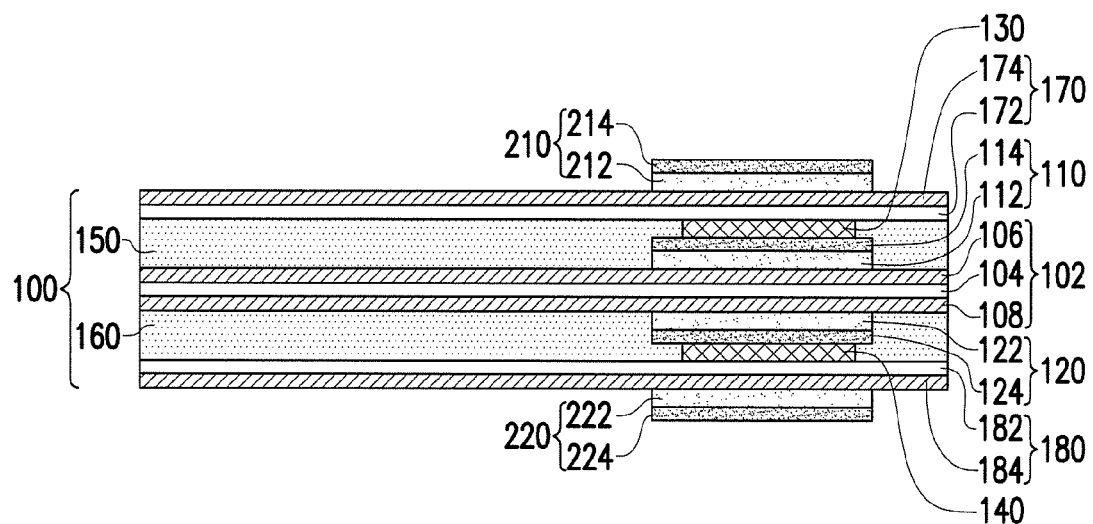

Next, referring to FIG. 1E, a third cover layer 210 and a fourth cover layer 220 are formed. The third cover layer 210 covers a portion of the first superposition layer 170, and the fourth cover layer 220 covers a portion of the second superposition layer 180. More specifically, the third cover layer 210 can include a third adhesive layer 212 and a third polyimide layer 214 in order from the bottom up, and the fourth cover layer 220 can include a fourth adhesive layer 222 and a fourth polyimide layer 224 in order from the bottom up.

In the present embodiment, a pretreatment can be performed using, for instance, a die cutter or a cutting method to obtain the third cover layer 210 and the fourth cover layer 220 having the desired size, and the size of the third cover layer 210 and the fourth cover layer 220 can be adjusted based on actual operating requirement. More specifically, the size of the third cover layer 210 is, for instance, comparable to the size of the fourth cover layer 220, and the size of the third cover layer 210 and the fourth cover layer 220 is, for instance, comparable to the size of the first cover layer 110 and the second cover layer 120.

Figure 1F:
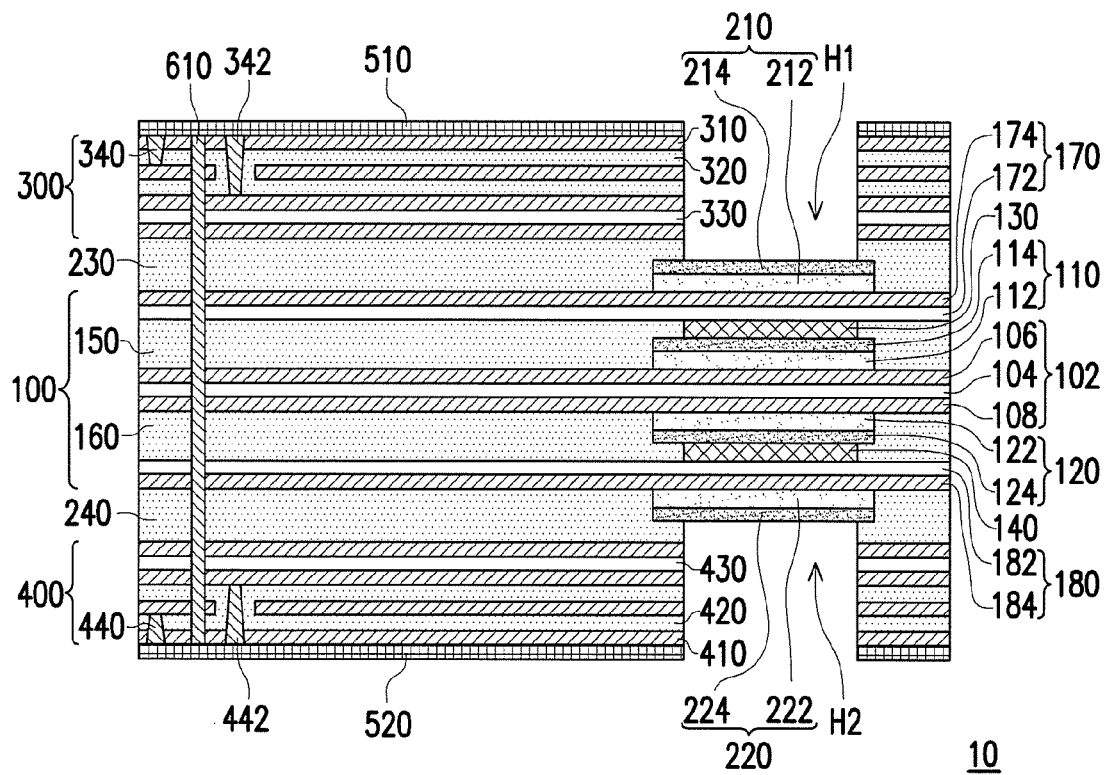

Next, referring to FIG. 1F, the flexible circuit board 100, the first rigid circuit board 300, and the second rigid circuit board 400 are laminated such that the third cover layer 210 and the first dielectric layer 230 are connected between the flexible circuit board 100 and the first rigid circuit board 300, and the fourth cover layer 220 and the second dielectric layer 240 are connected between the flexible circuit board 100 and the second rigid circuit board 400. The material of the first dielectric layer 230 and the second dielectric layer 240 is, for instance, polypropylene. In the present embodiment, the first rigid circuit board 300 has a first opening H1 to expose a portion of the third cover layer 210, and the second rigid circuit board 400 has a second opening H2 to expose a portion of the fourth cover layer 220.

More specifically, the first rigid circuit board 300 can include a plurality of first conductive layers 310, a plurality of first hard sheet insulating layers 320, a first hard sheet dielectric layer 330, and a plurality of first conductive vias 340 and 342. The first conductive layers 310 and the first hard sheet insulating layers 320 are alternately stacked, and the first conductive vias 340 and 342 pass through the first conductive layers and the first hard sheet insulating layers 320 such that the first conductive layers 310 are electrically connected. The second rigid circuit board 400 can include a plurality of second conductive layers 410, a plurality of second hard sheet insulating layers 420, a second hard sheet dielectric layer 430, and a plurality of second conductive vias 440 and 442. The second conductive layers 410 and the second hard sheet insulating layers 420 are alternately stacked, and the second conductive vias 440 and 442 pass through the second conductive layers 410 and the second hard sheet insulating layers 420 such that the second conductive layers 410 are electrically connected. In the present embodiment, the material of the first hard sheet insulating layers 320 and the second hard sheet insulating layers 420 is, for instance, polypropylene.

At the same time, a third conductive via 610 passing through the flexible circuit board 100, the first rigid circuit board 300, the second rigid circuit board 400, the first dielectric layer 230, and the second dielectric layer 240 can also be forming to electrically connect the flexible circuit board 100, the first rigid circuit board 300, and the second rigid circuit board 400.

For instance, an opening can be formed in the first conductive layers 310, the first hard sheet insulating layers 320, the second conductive layers 410, and the second hard sheet insulating layers 420 using a laser process, and then a conductive material is filled in the opening to form the first conductive vias 340 and 342 and the second conductive vias 440 and 442. Similarly, an opening can be forming in the flexible circuit board 100, the first rigid circuit board 300, the second rigid circuit board 400, the first dielectric layer 230, and the second dielectric layer 240 using a laser process, and then a conductive material is filled in the opening to form the third conductive via 610.

Next, referring further to FIG. 1F, a first solder resist layer 510 and a second solder resist layer 520 are respectively formed on the first rigid circuit board 300 and the second rigid circuit board 400. The function of the first solder resist layer 510 and the second solder resist layer 520 is, for instance, to protect the circuit structures on the first rigid circuit board 300 and the second rigid circuit board 400 (such as the first conductive layers 310 and the second conductive layers 410) from being affected during soldering, and oxidation phenomenon to the circuit structures can be prevented. As a result, the manufacture of the rigid flex circuit board 10 can be completed.

In the following, the rigid flex circuit board of the invention is described with reference to FIG. 1F. Referring to FIG. 1F, the rigid flex circuit board 10 can include a flexible circuit board 100, a first rigid circuit board 300, a second rigid circuit board 400, a first solder resist layer 510, and a second solder resist layer 520. The first rigid circuit board 300 having a first opening H1 and the second rigid circuit board 400 having a second opening H2 are respectively disposed on the first superposition layer 170 and the second superposition layer 180 of the flexible circuit board 100. Moreover, a third cover layer 210 and a first dielectric layer 230 are disposed between the first rigid circuit board 300 and the first superposition layer 170, and a fourth cover layer 220 and a second dielectric layer 240 are disposed between the second rigid circuit board 400 and the second superposition layer 180.

As shown in FIG. 1F, the flexible circuit board 100 can include a core layer 102, a first cover layer 110, a second cover layer 120, a first bonding layer 130, a second bonding layer 140, a first insulating layer 150, a second insulating layer 160, a first superposition layer 170, and a second superposition layer 180, wherein the core layer 102 can include a core dielectric layer 104, a first core circuit layer 106, and a second core circuit layer 108.

More specifically, the first cover layer 110 covers a portion of the first core circuit layer 106, and the second cover layer 120 covers a portion of the second core circuit layer 108. Moreover, the first bonding layer 130 covers a portion of the first cover layer 110, and the second bonding layer 140 covers a portion of the second cover layer 120. Different from the prior art in which a complete bonding layer is used to laminate the flex sheets, in the invention, the first core circuit layer 106 and the second core circuit layer 108 are partially covered respectively using the first cover layer 110 and the second cover layer 120, and then the first bonding layer 130 and the second bonding layer 140 are respectively partially laminated with the first cover layer 110 and the second cover layer 120. At the same time, the thickness of the first insulating layer 150 is, for instance, comparable to the thicknesses of the first cover layer 110 and the first bonding layer 130, and the thickness of the second insulating layer 160 is, for instance, comparable to the thicknesses of the second cover layer 120 and the second bonding layer 140.

Based on the above, the invention provides a rigid flex circuit board in which a polypropylene material is used as an insulating material between the flex sheets, the bent region of the flex sheets is a combination of a partially laminated cover layer and bonding layer, and the thickness of the insulating layer is comparable to the thicknesses of the cover layer and the bonding layer. As a result, layering between the bonding sheets under the process conditions of high temperature and high pressure can be prevented, and the reliability of the multi-layer flex sheet in thermal shock testing can be improved. At the same time, the design limit that copper layers cannot be stacked facing each other is overcame, and even if copper layers are disposed facing each other, the issue of short circuit still does not readily occur, and therefore the cost of the flex sheet material is reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A rigid flex circuit board, comprising:
    a flexible circuit board, the flexible circuit board comprising:
        a core layer comprising a core dielectric layer having a first surface and a second surface, a first core circuit layer, and a second core circuit layer, wherein the first core circuit layer and the second core circuit layer are respectively located on the first surface and the second surface;
        a first cover layer covering a portion of the first core circuit layer;
        a second cover layer covering a portion of the second core circuit layer;
        a first bonding layer covering a portion of the first cover layer;
        a second bonding layer covering a portion of the second cover layer;
        a first insulating layer covering a portion of the first core circuit layer and a portion of the first cover layer, wherein a thickness of the first insulating layer is comparable to thicknesses of the first cover layer and the first bonding layer;
        a second insulating layer covering a portion of the second core circuit layer and a portion of the second cover layer, wherein a thickness of the second insulating layer is comparable to thicknesses of the second cover layer and the second bonding layer;
        a first superposition layer comprising a first flex sheet layer and a first circuit layer and disposed on the first bonding layer and the first insulating layer; and
        a second superposition layer comprising a second flex sheet layer and a second circuit layer and disposed on the second bonding layer and the second insulating layer.

2. The rigid flex circuit board of claim 1, wherein the first cover layer comprises a first adhesive layer and a first polyimide layer in order from the bottom up, and the second cover layer comprises a second adhesive layer and a second polyimide layer in order from the bottom up.

3. The rigid flex circuit board of claim 2, further comprising:
    a first rigid circuit board having a first opening and disposed on the first superposition layer; and
    a second rigid circuit board having a second opening and disposed on the second superposition layer,
    wherein a first dielectric layer and a third cover layer are disposed between the first rigid circuit board and the first superposition layer, and the first opening exposes a portion of the third cover layer, and
    a second dielectric layer and a fourth cover layer are disposed between the second rigid circuit board and the second superposition layer, and the second opening exposes a portion of the fourth cover layer.

4. The rigid flex circuit board of claim 3, further comprising a third conductive via, wherein the third conductive via passes through the flexible circuit board, the first rigid circuit board, the second rigid circuit board, the first dielectric layer, and the second dielectric layer to electrically connect the flexible circuit board, the first rigid circuit board, and the second rigid circuit board.

5. The rigid flex circuit board of claim 1, wherein a material of the first bonding layer and the second bonding layer comprises a glue material.

6. The rigid flex circuit board of claim 1, further comprising:
a first rigid circuit board having a first opening and disposed on the first superposition layer; and
a second rigid circuit board having a second opening and disposed on the second superposition layer,
wherein a first dielectric layer and a third cover layer are disposed between the first rigid circuit board and the first superposition layer, and the first opening exposes a portion of the third cover layer, and
a second dielectric layer and a fourth cover layer are disposed between the second rigid circuit board and the second superposition layer, and the second opening exposes a portion of the fourth cover layer.

7. The rigid flex circuit board of claim 6, further comprising:
a first solder resist layer disposed on the first rigid circuit board; and
a second solder resist layer disposed on the second rigid circuit board.

8. The rigid flex circuit board of claim 6, further comprising a third conductive via, wherein the third conductive via passes through the flexible circuit board, the first rigid circuit board, the second rigid circuit board, the first dielectric layer, and the second dielectric layer to electrically connect the flexible circuit board, the first rigid circuit board, and the second rigid circuit board.

9. The rigid flex circuit board of claim 6, wherein
the first rigid circuit board comprises a plurality of first conductive layers, a plurality of first rigid insulating layers, and a plurality of first conductive vias, wherein the first conductive vias pass through the first conductive layers and the first rigid insulating layers such that the first conductive layers are electrically connected, and
the second rigid circuit board comprises a plurality of second conductive layers, a plurality of second hard sheet insulating layers, and a plurality of second conductive vias, wherein the second conductive vias pass through the second conductive layers and the second hard sheet insulating layers such that the second conductive layers are electrically connected.

10. The rigid flex circuit board of claim 9, further comprising:
a first solder resist layer disposed on the first rigid circuit board; and
a second solder resist layer disposed on the second rigid circuit board.

11. The rigid flex circuit board of claim 9, further comprising a third conductive via, wherein the third conductive via passes through the flexible circuit board, the first rigid circuit board, the second rigid circuit board, the first dielectric layer, and the second dielectric layer to electrically connect the flexible circuit board, the first rigid circuit board, and the second rigid circuit board.

* * * * *